United States Patent [19]

Noro et al.

[11] 4,447,791

[45] May 8, 1984

[54] POWER SUPPLY CHANGEOVER TYPE POWER AMPLIFIER

[75] Inventors: Masao Noro; Yoshiki Kasahara, both of Hamamatsu, Japan

[73] Assignee: Nippon Gakki Seizo Kabushiki Kaisha, Hamamatsu, Japan

[21] Appl. No.: 386,093

[22] Filed: Jun. 7, 1982

[30] Foreign Application Priority Data

Jun. 10, 1981 [JP] Japan .................................. 56-89360

[51] Int. Cl.³ ............................................. H03F 3/30
[52] U.S. Cl. .................................................. 330/297
[58] Field of Search ............... 330/127, 202, 262, 263, 330/297

[56] References Cited

U.S. PATENT DOCUMENTS 4,329,657 5/1982 Kamiya ................................ 330/297

Primary Examiner—James B. Mullins
Assistant Examiner—S. J. Mottola
Attorney, Agent, or Firm—Cushman, Darby & Cushman

[57] ABSTRACT

In a power supply changeover type amplifier arranged so that the voltages supplied from a plurality of power supplies to a power amplifying circuit are varied in accordance with the magnitude of level of an input signal which is to be amplified, arrangement is provided so that the plurality of power supplies having mutually equal output voltages are connected together in parallel and/or in series in accordance with the magnitude of the level of the input signal, and that the voltages resulting from the connection are supplied to the power amplifying circuit, to thereby enhance power efficiency of the amplifier and materialize its power supply section having a compact size and a light weight.

12 Claims, 15 Drawing Figures

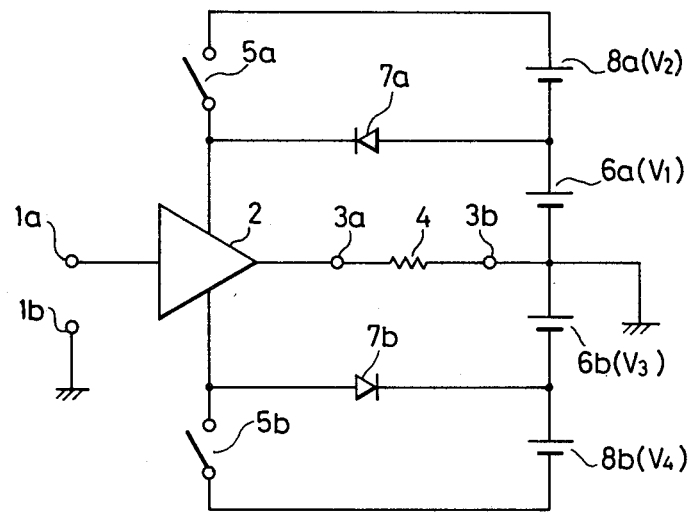
PRIOR ART FIG. 1
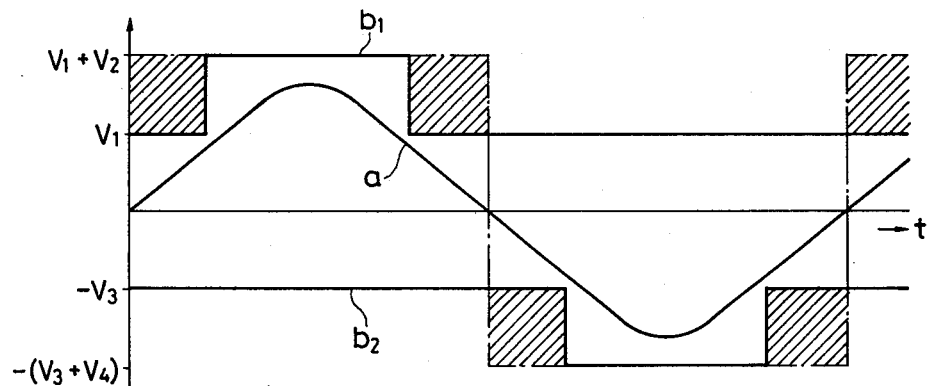
FIG. 2
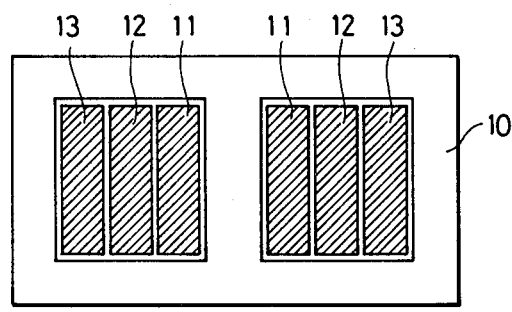
PRIOR ART FIG. 3

POWER SUPPLY CHANGEOVER TYPE POWER AMPLIFIER

BACKGROUND OF THE INVENTION

1. Field of the Invention

The present invention concerns generally a power amplifier, and more particularly it pertains to an amplifier of the power supply changeover type which is used in, for example, high fidelity reproduction of signals, and is operative so that the power supply voltage which is supplied to a power amplifier is varied in accordance with the level of the input signal which is to be amplified thereby, to improve the power efficiency.

2. Description of the Prior Art

In such conventional amplifier as shown in FIG. 1 which is intended for such high efficient reproduction of signals in audio systems, a signal applied across input terminals 1a and 1b is amplified in a power amplifying circuit 2 before being supplied to a loudspeaker serving as a load 4 connected between output terminals 3a and 3b. In case the signal which is amplified by the power amplifying circuit 2 is of a low level, i.e. small in amplitude, switches 5a and 5b are rendered "off" so that output voltages $+V_1$ and $-V_3$ of power supplied 6a and 6b are supplied to said power amplifying circuit 2 via diodes 7a and 7b, respectively. On the other hand, in case the signal is of a high level, i.e. a large amplitude, the switches 5a and 5b are rendered "on", so that a sum output voltage $+(V_1+V_2)$ of the power supplies 6a and 8a, and a sum output $-(V_3+V_4)$ of the power supplies 6b and 8b are supplied to the power amplifying circuit 2 via the switches 5a and 5b, respectively.

In such amplifier, the power supply voltages indicated by solid lines $b_1$ and $b_2$ are varied in accordance with the level indicated by a solid line a of the output signal of the power amplifying circuit 2 as shown in FIG. 2. Whereby, that power loss in the power amplifying circuit 2 corresponding to the hatched portion indicated in FIG. 2 is not developed, i.e. power efficiency is improved. Along therewith, the signal of a high level is outputted after being sufficiently amplified, without being clipped owing to a shortage of the power supply voltage.

It is to be noted here that the musical signals which are dealt with by such amplifier as mentioned above mostly are comprised of signals of low levels, or that the ratio of length of time which is occupied by only-seldom-appearing large amplitude signals in musical signals is very small, especially so in classical music. For this reason, in an amplifier of this type, it becomes necessary for materializing an amplifier as a whole having a compact size and a light weight to minimize the calorific power in its state that only the low voltage power supplies, i.e. power supplies 6a and 6b in FIG. 1, are used.

In FIG. 3 is shown a diagrammatic sectional view of a power transformer for power supplies 6a, 6b and 8a, 8b for the conventional amplifier shown in FIG. 1. This power transformer is comprised of a core 10, a primary coil 11 wound around this core 10, a first secondary coil 12 for the power supplies 6a and 6b, and a second secondary coil 13 for the power supplies 8a and 8b. In such power transformer, the second secondary coil 13 is intended for supplying a power only when a signal of a high level is amplified. Accordingly, the ratio of power supplying time through this winding 13 is very small as compared with the remaining windings. Nevertheless, during the period in which a power is being supplied through the winding 13, there also arises the necessity for supplying a large power. Accordingly, there is the need that this second secondary coil 13 possess a sufficiently large capacity, too. Further, there is required a smoothing capacitor of a large capacity, although not shown here, which is intended to smooth the rectified output of said second secondary coil 13.

On the other hand, as for the first secondary coil 12, there is needed a large size winding which generates as little heat as possible from the foregoing reasons, i.e. which has little copper loss, i.e. having a winding of a large diameter wire and having small resistance. However, in view of the fact that the abovesaid second secondary coil 13 occupies a large space, i.e. needing a large space factor, it will be understood that, in case it is intended to make the transformer compact in size, the first secondary coil 12 will be unable to secure such a sufficient space factor as it needs, and that accordingly the amount of its heat generation will become great. As discussed above, conventional amplifiers have the drawback that it has been difficult to materialize a power transformer having a compact size and a light weight so as to minimize a power amplifier in size and weight as a whole.

SUMMARY OF THE INVENTION

It is, therefore, a primary object of the present invention to provide an amplifier having a high power efficiency and being able to realize a power supply section which is compact in size and light in weight.

Another object of the present invention is to provide an amplifier of the type described above, which is capable of materializing a power transformer thereof having a compact size and a light weight.

Still another object of the present invention is to provide an amplifier of the type described above, which is capable of materializing a smoothing capacitor thereof having a small capacity.

BRIEF DESCRIPTION OF THE DRAWINGS

FIG. 1 is a circuit diagram showing an example of the structure of a conventional amplifier having a power supply switching.

FIG. 2 is a waveshape chart for explaining the operation of the conventional amplifier shown in FIG. 1.

FIG. 3 is a diagrammatic sectional view of a power transformer employed in the amplifier shown in FIG. 1.

DETAILED DESCRIPTION OF THE PREFERRED EMBODIMENTS

Figure 4:
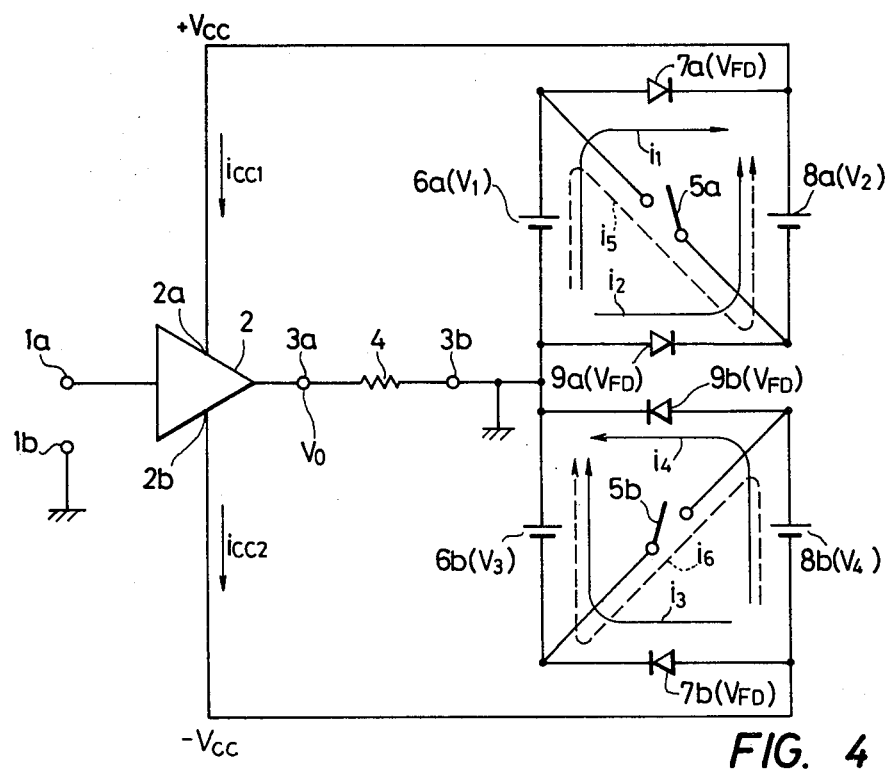
FIG. 4 is a circuit diagram showing the structure of an embodiment of the amplifier according to the present invention.

FIG. 4 is a circuit diagram showing the circuit arrangement of an embodiment of the amplifier according to the present invention. In FIG. 4, like parts corresponding to those shown in FIG. 1 are assigned like reference numerals and symbols, and their explanation is omitted. In FIG. 4, it will be noted that, between the ground and a positive power supply terminal $2a$ of a power amplifying circuit 2, there is inserted series connection of a power supply $6a$ having an output voltage $V_1$ and a diode $7a$ arranged in this order, which connection being obtained by connecting a positive terminal of the power supply $6a$ to an anode of said diode $7a$. Along therewith, there is also inserted therebetween a series connection of a diode $9a$ and a power supply $8a$ having an output voltage $V_2$ arranged in this order, which connection being obtained by connecting a cathode of said diode $9a$ to a negative terminal of the power supply $8a$. Futhermore, between the connecting point of the power supply $6a$ and the diode $7a$ and the connecting point of the diode $9a$ and the power supply $8a$, there is inserted a switch $5a$, i.e. a power supply changeover circuit, which is either capable of making on-off actions or which is variable of the degree of its conduction. This switch is so operative that, when the voltage $V_0$ of the output signal of the power amplifying circuit 2 is lower than a predetermined voltage level $V_{11}$ which is slightly lower than the voltage $V_1$, the switch $5a$ is rendered open, and when said voltage $V_0$ is higher than this predetermined voltage $V_{11}$, it is closed. It should be understood here that, for the above-stated reason, there is the need for the provision of a controlling circuit, though not shown, having a comparator which outputs a result of the comparison between the voltage $V_0$ and the predetermined voltage $V_{11}$.

Next, between a negative power supply terminal $2b$ of the power amplifying circuit 2 and the ground, there is inserted a series connection of a diode $7b$ and a power supply $6b$ having an output voltage $V_3$ which are arranged in this order, which connection being obtained by connecting a cathode of the diode $7b$ to a negative terminal of the power supply $6b$. Concurrently therewith, there is inserted therebetween a series connection of a power supply $8b$ having an output voltage $V_4$ and a diode $9b$ in this order, which connection being obtained by connecting a positive terminal of the power supply $8b$ to an anode of the diode $9b$. Also, between the connecting point of the power supply $6b$ and the diode $7b$ and the connecting point of the power supply $8b$ and the diode $9b$, there is inserted a switch $5b$ which is a power supply changeover circuit. This switch $5b$ is so operative that, when the voltage $V_0$ of the output signal of the power amplifying circuit 2 is higher than the level of a predetermined voltage $V_{33}$, i.e. a voltage which is slightly higher than the voltage $-V_3$, the switch $5b$ is broken, whereas when the voltage $V_0$ becomes lower than said predetermined voltage $V_{33}$, it is closed. In this case also, the provision of a controlling circuit having a circuit arrangement similar to that mentioned above is required. It should be noted here that, in such instance as stated above, the output voltage $V_1$ of the power supply $6a$ is equal to the output voltage $V_2$ of the power supply $8a$, and also that the output voltage $V_3$ of the power supply $6b$ is equal to the output voltage $V_4$ of the power supply $8b$.

In the circuit arrangement stated above, let us now assume that the output voltage $V_0$ of the power amplifying circuit 2 is of the below-mentioned relationship:

$$V_{33} \leq V_0 \leq V_{11} \tag{1}$$

which means that the signal which is to be amplified is a low-level signal. Whereupon, the switches $5a$ and $5b$ are both rendered to their broken state. Accordingly, the power supplies $6a$ and $8a$ are rendered to the state of being connected in parallel, because the diodes $7a$ and $9a$ are rendered conducting. On the other hand, the power supplies $6b$ and $8b$ also are rendered to the state of being connected in parallel since the diodes $7b$ and $9b$ are rendered conducting. As a result, there are supplied, to the power supply terminals $2a$ and $2b$ of the power amplifying circuit 2, power supply voltages $+V_{cc}$ and $-V_{cc}$, respectively, which are:

$$+V_{cc} = V_1 - V_{FD} = V_2 - V_{FD} \tag{2}$$

$$-V_{cc} = -V_3 + V_{FD} = -V_4 + V_{FD} \tag{3}$$

wherein: $V_{FD}$ represents the respective forward voltages of the diodes $7a$, $7b$, $9a$ and $9b$. In such instance, the currents $i_{cc1}$ and $i_{cc2}$ which flow via the abovesaid power supply terminals $2a$ and $2b$ are supplied from the power supplies $6a$ and $8a$, and also from the power supplies $6b$ and $8b$ in such directions as indicated by solid arrow lines $i_1$ and $i_2$, and solid arrow lines $i_3$ and $i_4$, respectively, as shown in FIG. 4. These respective currents are of the below-mentioned relationship:

$$\left. \begin{array}{l} i_{cc1} = i_1 + i_2 \\ i_1 = i_2 \end{array} \right\} \tag{4}$$

$$\left. \begin{array}{l} i_{cc2} = i_3 + i_4 \\ i_3 = i_4 \end{array} \right\} \tag{5}$$

On the other hand, when the voltage $V_0$ of the output signal is of the below-mentioned relationship:

$$V_0 < V_{33} \text{ or } V_0 > V_{11} \tag{6}$$

i.e. when the signal which is to be amplified is a high-level signal, the corresponding switch $5a$ or switch $5b$, as the case may be, is rendered to its closed state, so that either the diodes $7a$, $9a$ or the diodes $7b$, $9b$ are rendered to their "off" state. Accordingly, either the power supplies $6a$ and $8a$, or the power supplies $6b$ and $8b$ are placed into their series-connected state. Accordingly, in such an instance, there are supplied, to the power supply terminals $2a$ and $2b$ of the power amplifying circuit 2, power supply voltages $+V_{cc}$ and $-V_{cc}$, respectively, which are:

$$+V_{cc} = V_1 + V_2 \tag{7}$$

or $$-V_{cc} = -(V_3 + V_4) \tag{8}$$

Also, in this instance, currents $i_{cc1}$ and $i_{cc2}$ are supplied from the power supplies $6a$, $8a$ and the power supplies $6b$, $8b$ in such directions as indicated by the broken-line arrows $i_5$ and $i_6$, respectively. These currents are of the following relationship:

$$i_{cc1} = i_5 \quad (9)$$

$$i_{cc2} = i_6 \quad (10).$$

As stated, according to the instant embodiment explained above, it will be noted that, in case the signal which is to be amplified is a low-level signal, the power supplies 6a, 8a and the power supplies 6b, 8b are operated in their state of being connected in parallel, respectively. Also, in case the signal which is to be amplified is a high-level signal, either the power supplies 6a, 8a or the power supplies 6b, 8b are operated in their state of being connected in series, respectively. Accordingly, it is possible to lower the power loss in the output stage of the power amplifying circuit 2, and to thereby enhance the power efficientcy of the amplifier. Moreover, in this instant embodiment, it should be noted that, in case the signal which is to be amplified is a low-level signal, the currents which are to be supplied to the power amplifying circuit 2 are split into the currents of the power supplies 6a, 8a and are split into the currents of the power supplies 6b, 8b. And, the currents which are supplied by these respective power supplies will thus have a value of ½ of the currents which the power supplies 6a and 6b supply in the conventional amplifier. As a result, the degree of utility of the windings of the power transformer is improved, i.e. copper loss is reduced. Accordingly, it becomes possible to lower the amount of the heat generated by the power transformer. Therefore, it becomes possible to materialize a power transformer having a compact size and a light weight, and to reduce the manufacturing cost of the amplifier system.

In the above-mentioned amplifier, there is inserted a parallel connection of smoothing capacitors, not shown, of the power supplies 6a and 8a, respectively. Also, in a similar way, the smoothing capacitors in the respective the power supplies 6b and 8b also are connected in parallel. Thus, all of the smoothing capacitors will become effectively utilized. As a result, it becomes possible to accordingly reduce the capacities of the smoothing capacitors of the respective power supplies. Thus, it is possible to materialize the power supply sections having a further compact size and a further reduced weight, and hence to reduce the manufacturing cost.

And, in case there are used power supplies having the same arrangements as the power supplies 6a, 6b and 8a, 8b in both of the conventional amplifier and the instant embodiment of the amplifier according to the present invention, it will be noted that the capacities of the smoothing capacitors employed in the instant embodiment will become doubled as compared with those of the conventional system. Accordingly, the ripples of the power supply voltages supplied to the power amplifying circuit 2 will become markedly small as compared with those in the conventional amplifier system.

Figure 5:
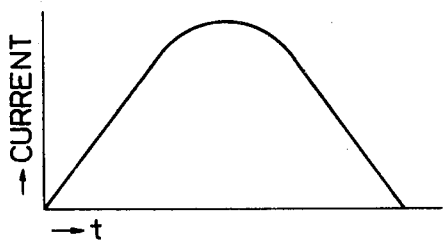
FIGS. 5 to 8 are waveshape charts for comparison of the currents of respective power supplies in the abovesaid embodiment of amplifier and in the conventional amplifier.
Figure 6:
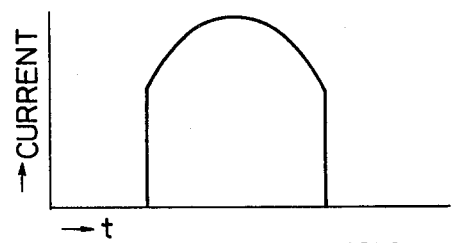
Figure 7:
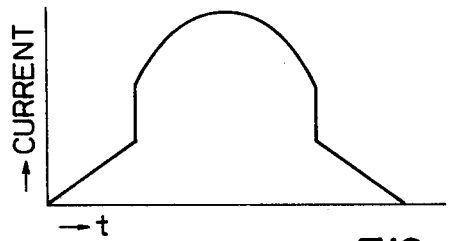
Figure 8:
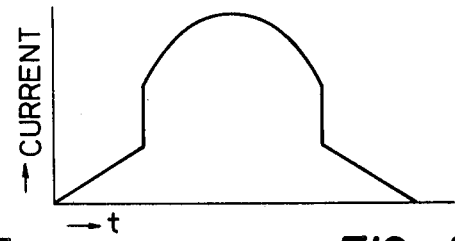

Also, when comparison is made with respect to the positive half cycle of a high-level sinusoidal signal, between the respective output currents of the power supplies employed in the conventional amplifier system and the respective output curretns of the power supplies 6a and 8a in the abovesaid instant embodiment, it will be noted that the respective output currents of the power supplies 6a and 8a in the conventional amplifier system will undergo a change as shown in FIGS. 5 and 6. Also, the respective output currents of the power supplies 6a and 8a in this instant embodiment will vary as shown in FIGS. 7 and 8. From these FIGS. 5 to 8, it will be noted clearly that, by following the instant embodiment, the variation factor of the output current of especially the power supply 8a becomes substantially small as compared with the conventional such system. Therefore, it will be noted that the occurrence of such interference as of switching noises can be reduced accordingly.

Next, description will be made of a first modification of the abovesaid embodiment, which is arranged so that the switches 5a and 5b, i.e. the power supply changeover circuits, employed in said embodiment are substituted by amplifying semiconductor devices and also that the rise-up and breaking of the power supply voltages $\pm V_{cc}$ are made smooth, to thereby further reduce the occurrence of switching noises.

Figure 9:
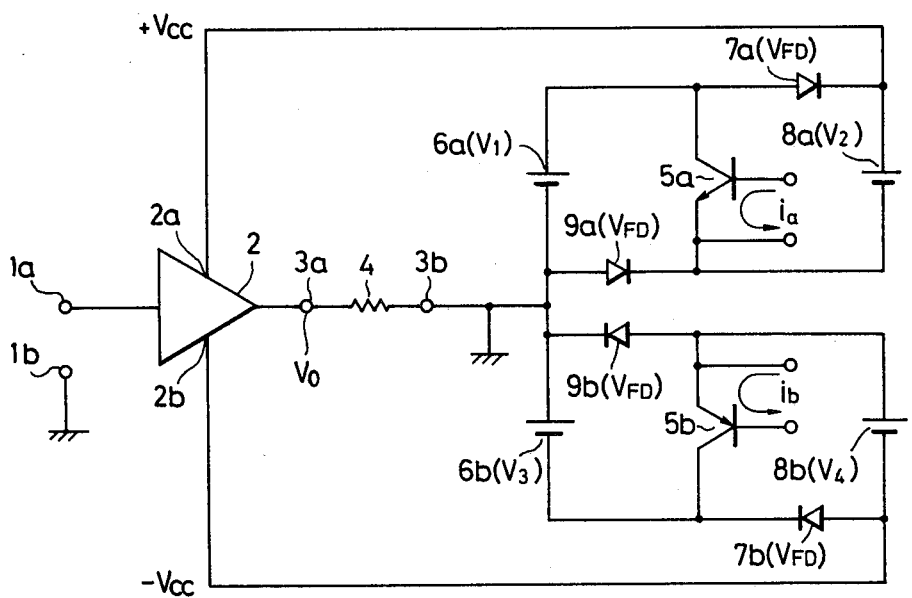
FIG. 9 is a circuit diagram showing a first modification of the amplifier structure of the abovesaid embodiment.
Figure 10:
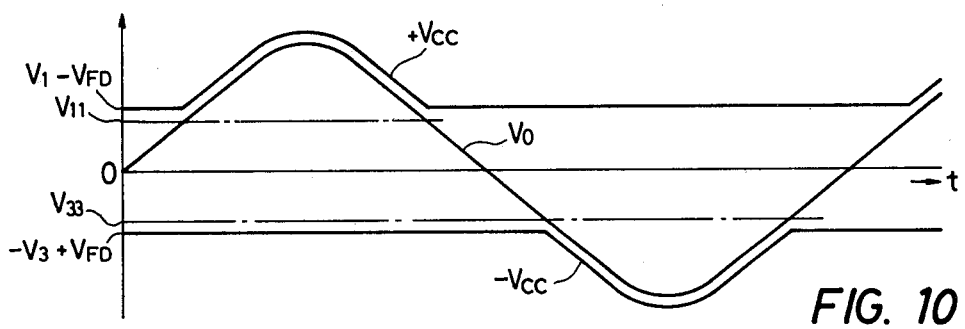
FIGS. 10 to 12 are waveshape charts for explaining the operation of the first modification of the amplifier structure shown in FIG. 9.
Figure 11:
Figure 12:
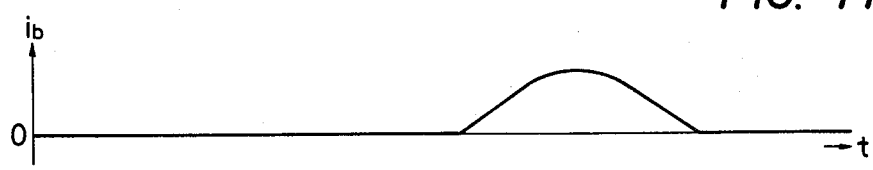

In FIG. 9, between the connecting point of the power supply 6a and the diode 7a and the connecting point of the diode 9a and the power supply 8a, there is inserted a transistor 5a which, in this embodiment, is an npn transistor. Current $i_a$ is supplied across the base electrode and the emitter electrode of this transistor 5a. This current $i_a$ is so controlled that, when the voltage $V_0$ exceeds the voltage $V_{11}$ as shown in FIG. 10, it will flow in accordance with the variation of the level of the voltage $V_0$ as shown in FIG. 11. Also, in FIG. 9, a transistor 5b which, in this embodiment, is a pnp transistor is inserted between the connecting point of the power supply 8b and the diode 9b and the connecting point of the diode 7b and the power supply 6b. Current $i_b$ is supplied across the emitter electrode and the base electrode of this transistor 5b. This current is so controlled that, when the voltage $V_0$ drops below the voltage $V_{33}$ as shown in FIG. 10, it will flow in accordance with the variation of the level of the voltage $V_0$ as shown in FIG. 12.

And, according to the amplifier shown in FIG. 9, the rise-up and the breaking of the power supply voltages $\pm V_{cc}$ of the power amplifying circuit 2 become to vary smoothly as shown in FIG. 10. Thus, such interference as of switching noises due to the changeover between parallel connection and series connection of the power supplies 6a, 8a and the power supplies 6b, 8b will hardly become generated.

Next, description will be made of a second modification of the embodiment shown in FIG. 4, which is arranged so that the respective power supply voltages $\pm V_{cc}$ of the power amplifying circuit 2 are generated by the use of three or more power supplies, respectively.

Figure 13:
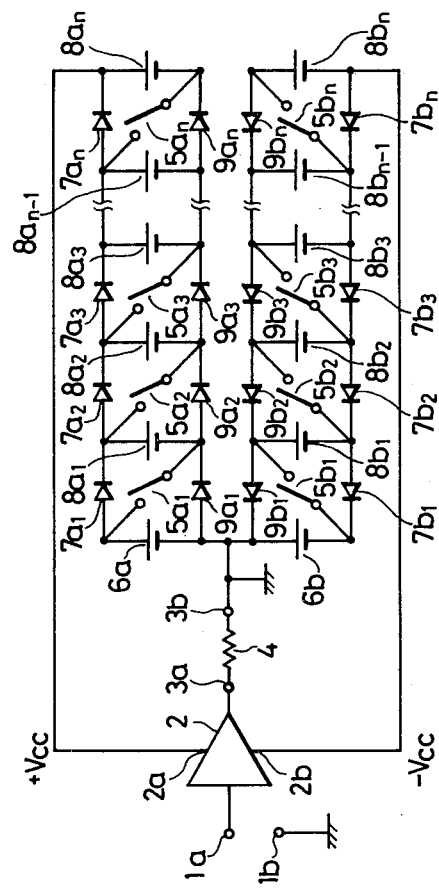
FIG. 13 is a circuit diagram showing a second modification of the amplifier structure of the abovesaid embodiment.

More particularly, FIG. 13 shows a circuit arrangement that the power supply voltages $\pm V_{cc}$ are generated by the use of power supplies which are provided (n+1) in number, respectively. As shown in FIG. 13, there are provided power supplies 6a, $8a_1$ to $8a_n$ serving to supply power supply voltages $+V_{cc}$. These power supplies are arranged so as to be changed over of their connection between parallel connection and series connection respectively by switches $5a_1$ to $5a_n$. Also, for the purpose of supplying power supply voltages $-V_{cc}$, there are provided power supplies 6b, $8b_1$ to $8b_n$. These power supplies are arranged to be changed over of their connection between parallel connection and series connection, respectively, by switches $5b_1$ to $5b_n$.

And, according to the abovesaid second modification of the amplifier structure, the number of power supplies which are to be series-connected to a parallel connection of power supplies can be changed in accordance with the magnitude of the voltage $V_0$, to thereby vary the power supply voltages $\pm V_{cc}$. For example, when the voltage $V_0$ is at a certain level and when the switch $5a_1$ alone is made, the power supply $6a$ is connected in series to those power supplies $8a_1$ to $8a_n$ which are in the state of being connected in parallel. On the other hand, when the voltage $v_0$ has elevated to the abovesaid level, and when the switches $5a_1$ and $5a_2$ are made, the series-connected power supplies $6a$ and $8a_1$ will become series-connected to the power supplies $8a_2$ to $8a_n$ which are connected together in parallel. Accordingly, by the circuit arrangement of this instant modification, it is possible to effect changeover of connections of power supply voltages $\pm V_{cc}$ in n steps depending on the magnitude of the voltage $V_0$, so that a further improvement of the power efficiency can be materialized.

Figure 14:
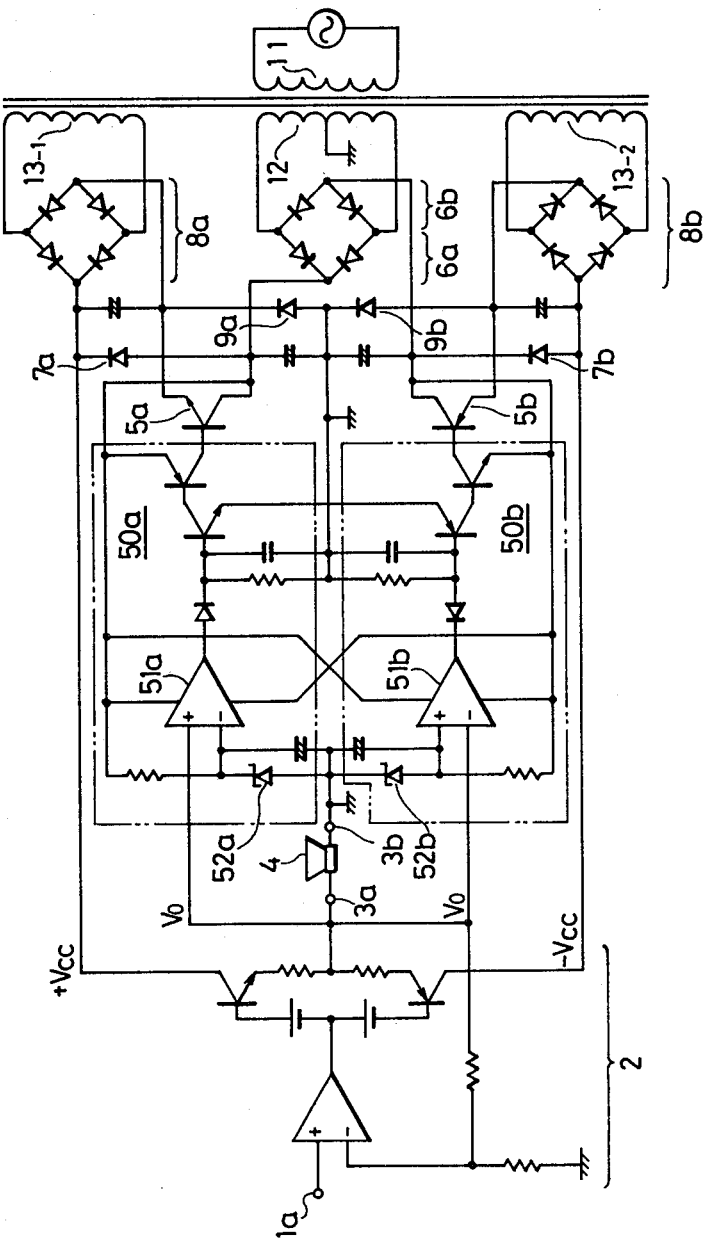
FIG. 14 is a circuit diagram showing a first concrete circuit arrangement of the abovesaid embodiment.
Figure 15:
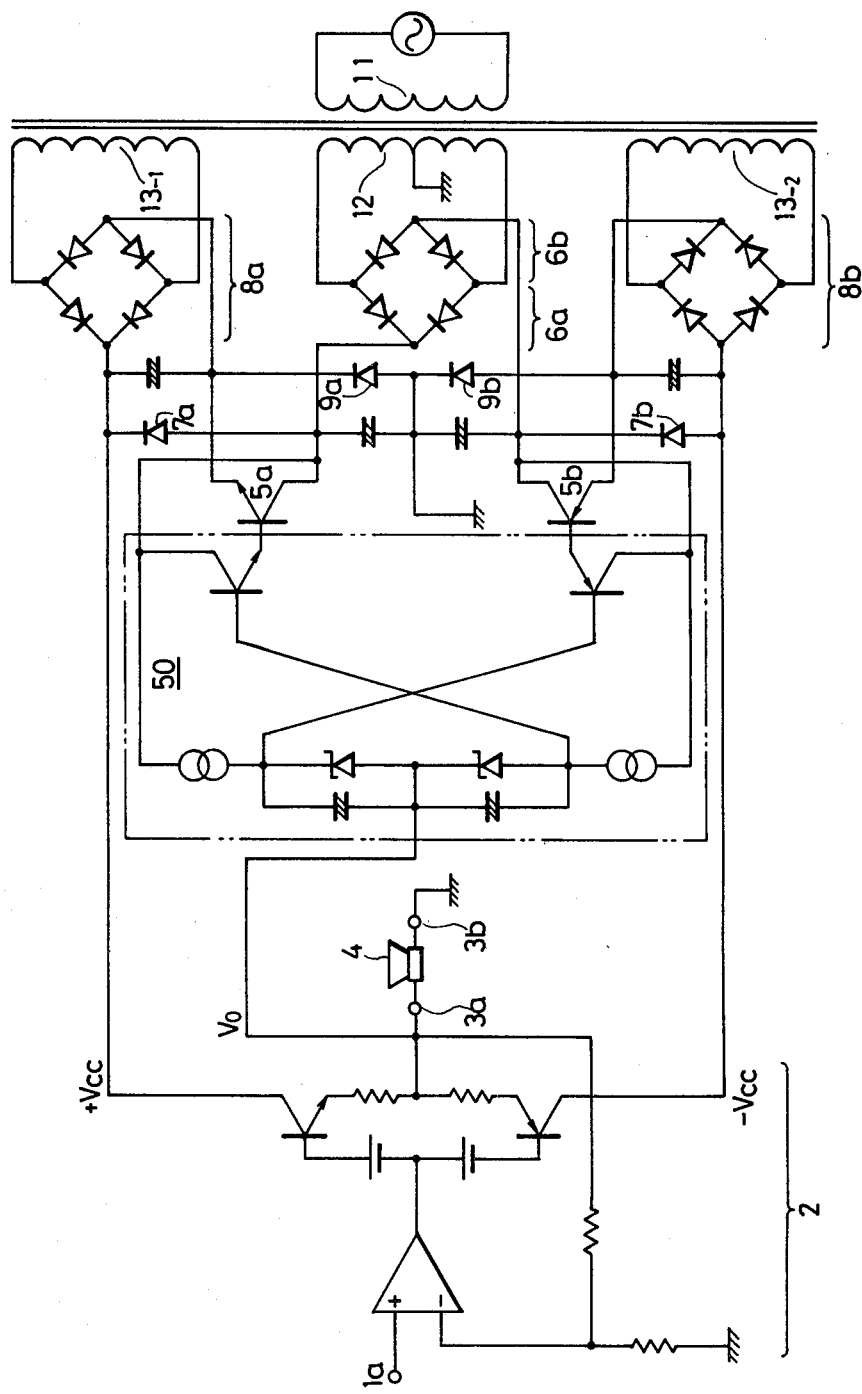
FIG. 15 is a circuit diagram showing a concrete circuit arrangement of said first modification of the amplifier structure of the abovesaid embodiment.

Next, an example of concrete circuit arrangement of the embodiment shown in FIG. 4 is illustrated in FIG. 14, and an example of concrete circuit arrangement of the modified example shown in FIG. 9 is illustrated in FIG. 15.

In the concrete circuit arrangement shown in FIG. 14, the transistors $5a$ and $5b$ which correspond to the priorly described power supply changeover circuits are arranged so that they are controlled by controlling circuits $50a$ and $50b$, respectively, which use the output voltage $V_0$ of the power amplifying circuit 2 as their input. In this concrete circuit arrangement, those parts corresponding to those in FIG. 4 are assigned like reference numerals and symbols, and their explanation is omitted.

The controlling circuits $50a$ and $50b$ have their comparators $51a$ and $51b$, respectively, which are each comprised of an operating amplifier. These comparators $51a$ and $51b$ function to compare the voltages which are preliminarily set by Zener diodes $52a$ and $52b$ with said voltage $V_0$, and when the voltage $V_0$ exceeds said preliminarily set voltage, the controlling circuit $50a$ outputs a positive output voltage, while the controlling circuit $50b$ outputs a negative output voltage, to thereby render the transistors $5a$ and $5b$ conducting, respectively, as the case may be. When, for example, the transistor $5a$ is rendered "on", the power supplies $6a$ and $8a$ which till then have been connected in parallel via the diodes $7a$ and $9a$, respectively, will become to be connected together in series via the transistor $5a$. It should be understood here that reference numerals 13-1 and 13-2 represent second secondary coils which are split into two windings as shown. It should be noted also that the respective power supplies are each comprised of a diode bridge and a smoothing capacitor.

Next, in the concrete circuit arrangement shown in FIG. 15, arrangement is made so that the transistors $5a$ and $5b$ are each controlled by a single controlling circuit 50. In this concrete circuit, those parts corresponding to those in FIGS. 4 and 9 are assinged like reference numerals and symbols, to omit their explanation.

The controlling circuit 50 is so arranged that, when the output voltage $V_0$ swings to either the positive side or the negative side, and when its absolute value exceeds a predetermined value, it outputs such respective difference voltage to thereby control the degree of conduction of the transistors $5a$ and $5b$, respectively.

What is claimed is:
1. A power supply changeover type amplifier, comprising:
  power amplifying circuit means for power-amplifying a signal inputted to its input terminal;
  a plurality of power supplies for supplying power supply voltages to said power amplifying circuit means; and
  changeover circuit means for changing over voltages supplied to said power amplifying circuit means from said plurality of power supplies, in accordance with a level of said signal to be power-amplified in said power amplifying circuit means;
  said plurality of power supplies outputting voltages which are equal in level to each other, and
  said changeover circuit means connecting said plurality of power supplies together in series and/or in parallel to form certain voltage by those voltages supplied by the plurality of power supplies and supply the certain voltage to said power amplifying circuit.

2. A power supply changeover type amplifier according to claim 1, in which:
  said plurality of power supplies contain unidirectional semiconductor devices connected between electrodes of a same polarity of the adjacently disposed power supplies, and also contain said changeover circuit means connected between electrodes of mutually different polarities of said adjacently disposed power supplies.

3. A power supply changeover type amplifier according to claim 2, further comprising:
  a controlling circuit means for controlling said changeover circuit means in accordance with a level of said signal amplified in said power amplifying circuit means.

4. A power supply changeover type amplifier according to claim 3, in which:
  said controlling circuit means contains a comparing means for comparing a level of said signal amplified in said power amplifying circuit means with a level of a predetermined voltage level.

5. A power supply changeover type amplifier according to claim 4, in which:
  said changeover circuit means is comprised of a switch means which is made or broken in accordance with a result of comparison done by said comparing means.

6. A power supply changeover type amplifier according to claim 4, in which:
  said changeover circuit means is comprised of an amplifying semiconductor device which is controlled of its condition degree in accordance with a result of comparison done by said comparing means.

7. A power supply changeover type amplifier according to claim 6, in which:
  said comparing means outputs a signal of a magnitude corresponding to a level of said signal when the level of said signal exceeds a predetermined value.

8. A power supply changeover type amplifier according to claim 1, in which:
  said certain voltages are each able to assume two different values.

9. A power supply changeover type amplifier according to claim 1, in which:
  said certain voltages each can vary their values stepwise in accordance with a level of said signal amplified in said power amplifying circuit means.

10. A power supply changeover type amplifier according to claim 9, in which:

said certain voltage is able to assume three or more values obtained in accordance with both arbitrary number of power supplies among said plurality of power supplies which are connected in series by virtue of a changeover action of said changeover circuit means and the number of remaining ones of said plurality of power supplies which are connected in parallel.

11. A power supply changeover type amplifier according to claim 1, in which:
said plurality of power supplies are each comprised of two power supply system.

12. A power supply changeover type amplifier according to claim 11, in which:
said changeover circuit means is provided in plural number corresponding to power supplies of respective polarities.

* * * * *